(12) United States Patent
Handy et al.

(10) Patent No.: US 10,830,808 B2
(45) Date of Patent: Nov. 10, 2020

(54) CIRCUIT AND METHOD FOR DETECTING ARC FAULTS

(71) Applicant: GE Aviation Systems Limited, Cheltenham (GB)

(72) Inventors: Peter James Handy, Cheltenham (GB); Julian Peter Mayes, Cheltenham (GB)

(73) Assignee: GE Aviation Systems Limited, Cheltenham (GB)

( * ) Notice: Subject to any disclaimer, the term of this patent is extended or adjusted under 35 U.S.C. 154(b) by 232 days.

(21) Appl. No.: 16/066,066

(22) PCT Filed: Jan. 20, 2017

(86) PCT No.: PCT/EP2017/051181
§ 371 (c)(1),
(2) Date: Jun. 26, 2018

(87) PCT Pub. No.: WO2017/129487
PCT Pub. Date: Aug. 3, 2017

(65) Prior Publication Data
US 2019/0011492 A1    Jan. 10, 2019

(30) Foreign Application Priority Data

Jan. 25, 2016  (GB) .................................. 1601307.0

(51) Int. Cl.
*G01R 31/12* (2020.01)
*G01R 31/00* (2006.01)
(Continued)

(52) U.S. Cl.
CPC ....... *G01R 31/1272* (2013.01); *G01R 31/008* (2013.01); *G01R 31/327* (2013.01);
(Continued)

(58) Field of Classification Search
CPC ........ G01R 31/50; G01R 31/52; G01R 31/54; G01R 31/55; G01R 31/56
See application file for complete search history.

(56) References Cited

U.S. PATENT DOCUMENTS

| 3,126,169 A | 3/1964 | Kucher |
| 5,729,145 A | 3/1998 | Blades |

(Continued)

FOREIGN PATENT DOCUMENTS

| CN | 203324424 U | 12/2013 |
| CN | 103823502 A | 5/2014 |

(Continued)

OTHER PUBLICATIONS

International Search Report and Written Opinion issued in connection with corresponding PCT application No. PCT/EP2017/051181 dated May 8, 2017.

(Continued)

*Primary Examiner* — Tung X Nguyen
(74) *Attorney, Agent, or Firm* — McGarry Bair PC

(57) ABSTRACT

An apparatus and method for detecting arc faults in a circuit having a switch (28), including a leakage current management device (46), an arc fault detector (30) arranged to monitor output voltage and to send a signal representative of the output voltage, and a controller (36) coupled to the arc fault detector (30). The controller (36) is configured to monitor the output voltage signal, compare the output to a threshold, and if the output exceeds the threshold, provide an arc fault indication.

24 Claims, 5 Drawing Sheets

(51) Int. Cl.
*G01R 31/327* (2006.01)
*G01R 31/50* (2020.01)
*H02H 1/00* (2006.01)
*H01H 9/50* (2006.01)

(52) U.S. Cl.
CPC ............ *G01R 31/50* (2020.01); *H02H 1/0015* (2013.01); *H02H 1/0092* (2013.01); *B64D 2221/00* (2013.01); *H01H 9/50* (2013.01)

(56) References Cited

U.S. PATENT DOCUMENTS

| | | | |
|---|---|---|---|
| 7,177,125 | B2 | 2/2007 | Lazarovich et al. |
| 7,489,138 | B2 | 2/2009 | Yu |
| 8,004,802 | B2 | 8/2011 | Elms |
| 2004/0263183 | A1 | 12/2004 | Naidu |
| 2007/0058304 | A1 | 3/2007 | Parker et al. |
| 2008/0133154 | A1 | 6/2008 | Krauss |
| 2016/0099569 | A1* | 4/2016 | Rilling ............... G01R 31/3278 307/125 |
| 2018/0149689 | A1* | 5/2018 | Ollitrault ............. G01R 19/257 |

FOREIGN PATENT DOCUMENTS

| | | |
|---|---|---|
| CN | 104678265 A | 6/2015 |
| CN | 104979797 A | 10/2015 |
| EP | 2654153 A1 | 12/2006 |
| EP | 2706636 A1 | 3/2014 |
| EP | 2766968 | 8/2014 |
| JP | H0484673 A | 3/1992 |
| JP | H08223721 A | 8/1996 |
| WO | 2008034092 A2 | 3/2008 |
| WO | 20150075410 A1 | 5/2015 |

OTHER PUBLICATIONS

Chinese Patent Office, Office Action re Chinese Patent Application No. 201780008162.1, dated Feb. 6, 2020, 11 pages, China.

Intellectual Property Office, Examination Report Under Section 18(3) re Application No. GB1601307.0, dated Feb. 12, 2020, 3 pages, South Wales, NP.

* cited by examiner

CIRCUIT AND METHOD FOR DETECTING ARC FAULTS

BACKGROUND

Electrical systems, such as those found in an aircraft power distribution system, employ electrical bus bars and miles of wiring for delivering power from electrical power sources to electrical loads. In the event of an electrical arc fault or other failure condition, high currents might be transmitted through a normally nonconductive medium, such as air, with unexpected consequences for the power distribution system at or about the arcing failure point.

BRIEF DESCRIPTION

In one aspect, an apparatus for detecting arc faults in a circuit having a switch, including a leakage current management device, an arc fault detector arranged to monitor output voltage across the leakage current management device while the switch is open, and to send a signal representative of the output voltage, and a controller coupled to the arc fault detector. The controller is configured to monitor the output voltage signal, apply a moving average filter to the output voltage signal to obtain a filtered output, compare the filtered output to a threshold, and if the filtered output exceeds the threshold, provide an arc fault indication.

In another aspect, a method of detecting arc faults in a circuit having a switch, including obtaining output voltage values from a switch while the switch is open, applying a moving average filter to the output voltage values to obtain a filtered output, comparing the filtered output to a threshold, and if the filtered output exceeds the threshold, providing an arc fault indication.

In yet another aspect, a method of detecting arc faults in a circuit having a switch, including obtaining output voltage values from a switch after the switch is open, monitoring a rate of change in the output voltage values, comparing the rate of change to a threshold, and if the rate of change exceeds the threshold, providing an arc fault indication.

DETAILED DESCRIPTION

The described embodiments of the present invention are directed to an electrical power distribution system, which can be used, for example, in an aircraft. While this description is primarily directed toward a power distribution system for an aircraft, it is also applicable to any environment using an electrical system for transmitting power from a power source to an electrical load.

Figure 1:
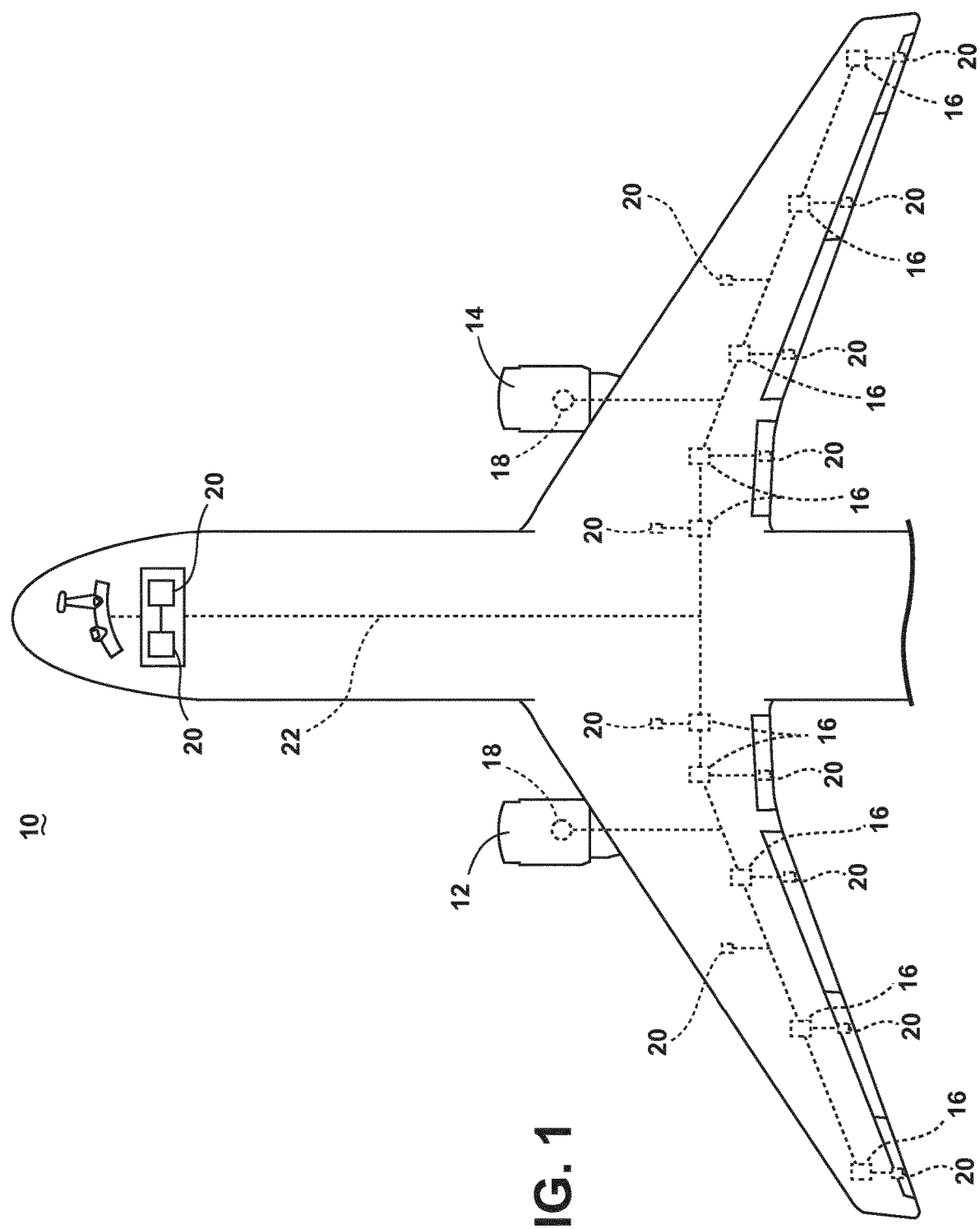
FIG. 1 is a top down schematic view of an aircraft and power distribution system of an aircraft, in accordance with various aspects described herein.

As illustrated in FIG. 1, an aircraft 10 is shown having at least one gas turbine engine, shown as a left engine system 12 and a right engine system 14. Alternatively, the power system can have fewer or additional engine systems. The left and right engine systems 12, 14 can be substantially identical, and can further include at least one power source, such as an electric machine or a generator 18. The aircraft is shown further having a set of power-consuming components, or electrical loads 20, such as for instance, an actuator load, flight critical loads, and non-flight critical loads. The electrical loads 20 are electrically coupled with at least one of the generators 18 via a power distribution system including, for instance, power transmission lines 22 or bus bars, and power distribution nodes 16. It will be understood that the illustrated embodiment of FIG. 1 is only one non-limiting example of a power distribution system, and many other possible embodiments and configurations in addition to that shown are contemplated by the present disclosure. Furthermore, the number of, and placement of, the various components depicted in FIG. 1 are also non-limiting examples of embodiments associated with the disclosure.

In the aircraft 10, the operating left and right engine systems 12, 14 provide mechanical energy which can be extracted, typically via a spool, to provide a driving force for the generator 18. The generator 18, in turn, generates power, such as AC or DC power, and provides the generated power to the transmission lines 22, which deliver the power to the power distribution nodes 16, positioned throughout the aircraft 10. The power distribution nodes 16 receive the AC or DC power via the transmission lines 22, and can provide switching, power conversion, or distribution management functions, as needed, in order to provide the desired electrical power to the electrical loads 20 for load operations.

Example power distribution management functions can include, but are not limited to, selectively enabling or disabling the delivery of power to particular electrical loads 20, depending on, for example, available power distribution supply, criticality of electrical load 20 functionality, or aircraft mode of operation, such as take-off, cruise, or ground operations. Additional management functions can be included.

Furthermore, additional power sources for providing power to the electrical loads 20, such as emergency power sources, ram air turbine systems, starter/generators, or batteries, can be included, and can substitute for the power source. It will be understood that while one embodiment is shown in an aircraft environment, the invention is not so limited and has general application to electrical power systems in non-aircraft applications, such as other mobile applications and non-mobile industrial, commercial, and residential applications.

Figure 2:
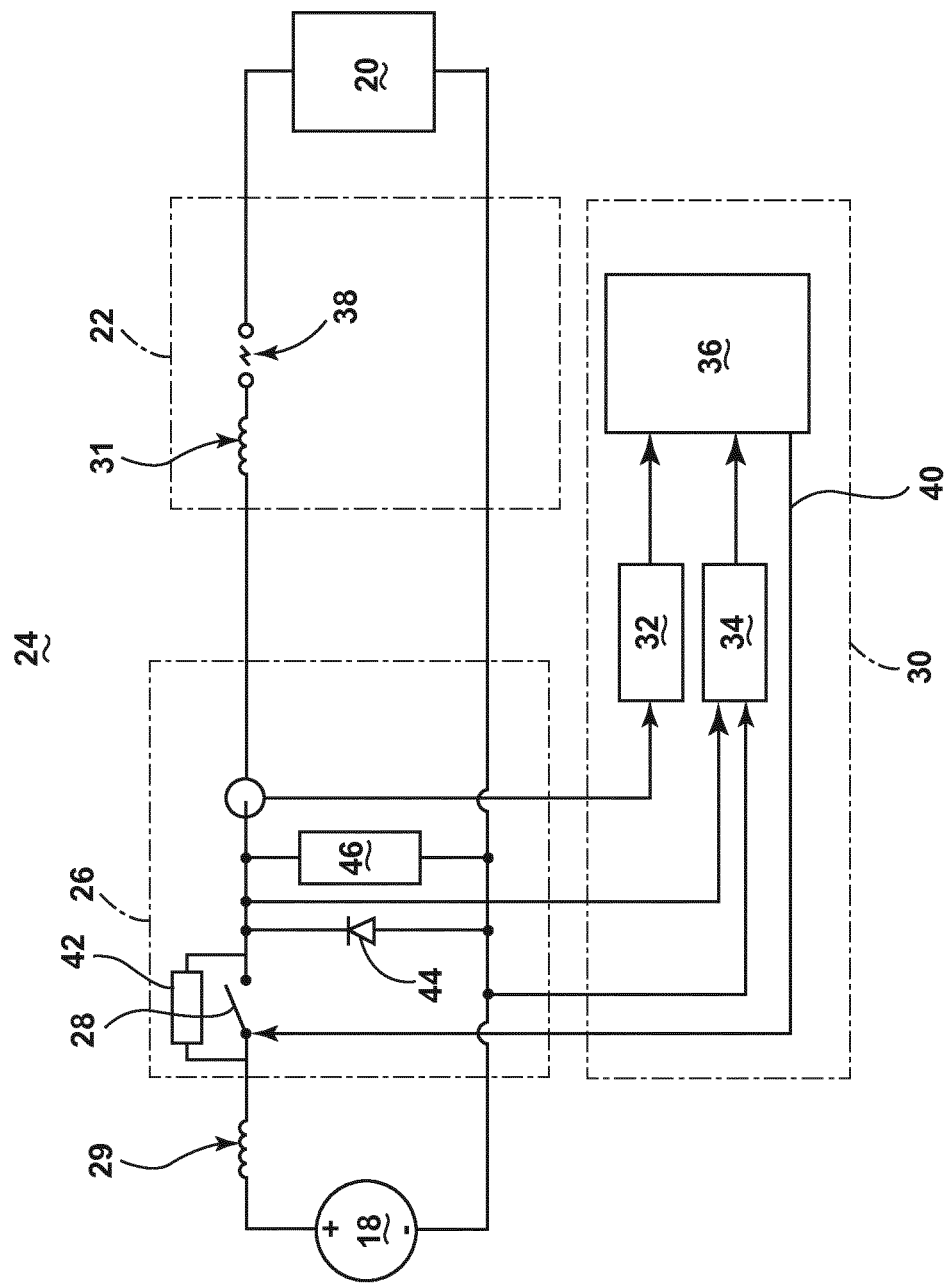
FIG. 2 is a schematic circuit diagram of a power distribution system, in accordance with various aspects described herein.

FIG. 2 illustrates an exemplary schematic circuit diagram of a power distribution system 24, such as an exemplary power distribution system in an aircraft, comprising a generator 18, an electrical switch, such as a solid state switch 26, electrical interconnects, such as electrical transmission wires 22, cables, cable junctions, or bus bars, an electrical load 20, and an arc fault detector 30. As shown, the generator 18 is electrically coupled with the solid state switch 26, which is further electrically coupled to the arc fault detector 30 and the electrical load 20. The solid state switch 26 is coupled with the electrical load via the transmission wires 22. The solid state switch 26 can include a switching component 28 and a transient suppression device configured across the switching component 28, such as a transorb 42. The solid state switch 26 can also include a diode 44 biased from, for example, electrical ground to the power line, downstream from the switching component 28, and a leakage current management device 46 electrically in parallel with the diode 44. The leakage current management device 46 can include at least one power consuming device, such as a resistor.

As shown, the power distribution system 24 can also include a first inductance 29, for example transmission wire inductance upstream of the solid state switch 26, positioned near the generator 18. The power distribution system 24 can further include a second inductance 31, for example, an inherent transmission wire 22 inductance downstream of the solid state switch 26. For illustrative purposes, the transmission wires 22 are further shown having an example series transient electrical event 38, such as a series arc fault. While a series arc fault is illustrated and described, embodiments of the disclosure are equally applicable to parallel transmission wire 22 faults.

In an aircraft embodiment, for example, an operating gas turbine engine can provide mechanical energy which can be extracted via a spool, to provide a driving force for the generator 18. The generator 18, in turn, provides the generated power to the solid state switch 26, which delivers the power to the electrical loads 20, via the transmission wires 22, when the switching component 28 is closed or in a closed state. When the switching component 28 is opened or in an open state, the interruption of the current in the power distribution system 24 causes a current decay through the transorb 42 as the transorb 42 suppresses the transient electrical signal generated by the configuration of the diode 44 and the first and second inductances 29, 31.

Additionally, the leakage current management device can be configured to dissipate at least a portion of power due to a leakage current or voltage experienced by the solid state switch 26 while the switching component 28 is in the open state. The leakage current management device 46 can optionally be disabled, or configured to dissipate a different portion of power while the switching component 28 is in a closed state.

One example of the solid state switch 26 includes a silicon carbide (SiC) or Gallium Nitride (GaN) based, high bandwidth power switch. SiC or GaN can be selected based on their solid state material construction, their ability to handle large power levels in smaller and lighter form factors, and their high speed switching ability to perform electrical operations very quickly. Additional examples of the solid state switch 26 can comprise silicon-based power switches, also capable of high speed switching.

The arc fault detector 30 can include a current sensor 32 capable of sensing or measuring the electrical current characteristics of current flowing through the power distribution system 24, a voltage sensor 34 capable of measuring the voltage characteristics of the system 24, and a controller, such as a microcontroller or processor 36. As illustrated, the leakage current management device 46 is electrically position upstream of the current being sensed by the current sensor 32. The arc fault detector 30 can further provide a control signal 40 from the processor 36 to the switching component 28, wherein the control signal 40 is capable of controlling the switching component 28, and thus, controlling operation of the solid state power switch 26.

Each of the current and voltage sensors 32, 34 provide respective sensed current or voltage characteristic to the processor 36. Example current characteristics measurable include, but are not limited to, instantaneous current, average current, or rate of change in current. Likewise, example voltage characteristics measurable include, but are not limited to, instantaneous voltage, average voltage, of rate of change in voltage. While each of the current sensor 32 and voltage sensor 34 are illustrated measuring the respective current and voltage characteristics at the solid state switch 26, other measurement locations are envisioned so long as the measurements are captured downstream from the switching component 28 and upstream from the leakage current management device 46. Embodiments of the disclosure can include the current and voltage sensors 32, 34 providing the respective sensed current or voltage characteristic to the processor 36 while the switching component 28 is in the open state or the closed state. In this sense, when the switching component 28 is in the open state, the current and voltage sensors 32, 34 can provide a respective sensed leakage current or leakage voltage characteristic to the processor 36, such that the arc fault detector 30 or the processor 36 is arranged to monitor the current or voltage across the leakage current management device 46.

While the current or voltage sensors 32, 34 are described as "sensing" or "measuring" the respective electrical current and voltage characteristics of the power distribution system 24, it is envisioned that sensing or measuring can include a determination of a value indicative, related to, or representative of the electrical current or voltage characteristics, and not the actual current or voltage values. It is also envisioned that the current or voltage sensors 32, 34 can provide respective current or voltage characteristics, as described above, and the processor 36 can perform processing on the characteristics. Additionally, an alternative configuration is envisioned wherein the current and voltage sensors 32, 34 are integrated with the processor 36. In yet another alternative configuration, the processor 36 can be located remote from the arc fault detector 30, and can be communicatively coupled with the arc fault detector.

Electrical arcs might occur in an environment where, for example, physical defects in an electrical connection cause a permanent or temporary loss in transmission capabilities. Where a physical separation occurs, the voltage difference between each of the separated terminals in addition to a short distance of separation, can allow for an electrical arc to strike between the terminals. The electrical system can see the electrical arcing event as a sudden or short current reduction, caused by the voltage drop across the separation. In an environment with vibrations, for instance, as in a moving aircraft, a physical defect in an electrical connection might result in intermittent arcing events as the vibrations disconnect and reconnect the electrical connection at the point of the physical defect. In another example embodiments, an electrical arc might be caused by, or relate to a loose terminal connection, or a drawn series fault.

The arc fault detector 30 operates by providing current or voltage characteristics of the power distribution system 24, as measured by the respective current or voltage sensors 32, 34, to the processor 36. The processor 36 is configured to determine whether a suspected electrical fault, such as an arc fault (hereinafter referred to as an arcing event), is occurring or has occurred, based on the current or voltage characteristics. For example, the processor 36 can apply a moving average filter to the current or voltage characteristics to obtain or generate a filtered output indicative of or representing the moving average of the current or voltage characteristic while the switching component 28 is in the opened state. The processor 36 can further compare the filtered output to a respective current or voltage characteristic threshold, which can be stored in a memory of the processor 36 or readable by the processor 36. If the filtered output exceeds the threshold, or in response to the filtered output exceeding the threshold, the processor 36 can perform some further operation or function indicative of an arc fault. In this sense, the processor 36 can utilize the leakage current management device operation to determine when an arc event is or has occurred.

Non-limiting example operations or functions performed by the processor 36 indicative of an arc fault event can include providing an indication of the electrical fault, such as a digital error message, an audio indicator such as an alarm, or a visual indicator such as a blinking light, to a user or another system, such as an error logging system. In another alternative configuration, the processor 36 can indicate the arc fault event by permanently or temporarily disabling at least a portion of the power distribution system 24, or reducing the power delivered by the system 24 to reduce the impact of any continued arcing event.

In yet another alternative configuration of the power distribution system 24, the arc fault detector 30 can operate as a secondary method or a secondary apparatus to confirm or to correlate the detection of a possible arc fault by a primary arc detecting system. For example, in response to a possible or suspected arc fault detected by the primary system, which can include a set or subset of the arc fault detector 30 or power distribution system 24, the arc fault detector 30 can operate to confirm or build a minimal level of confidence in the detection of the arc fault, as described herein. In one embodiment of the disclosure, the primary arc detecting system can detect a possible arcing event while the solid state switch 26 or the switching component 28 is in the closed state. Following this primary indication of a possible arc fault, the arc fault detector 30 or processor 36 can control the switching component 28, by way of the control signal 40, to set the switching component 28 to the opened state. While the switching component 28 is in the opened state, the arc fault detector 30 can operate as described herein to confirm the arc fault by way of determining whether the possible electrical fault is occurring or has occurred, based on the current or voltage characteristics.

As used herein, a "moving average" is a statistical representation of analyzed data by creating a series of averages of different subsets of a full data set. For example, an average may be taken every second of data in the previous three seconds. The subset of the full data set is modified by "shifting" the subset to a new subset eliminating a portion of the oldest data while including a portion of the newest data, and recalculating the average of the new subset. The example of the moving average of the previous three seconds is merely one non-limiting example, and additional or alternative moving average periods or "windows" can be included. The moving average can also be referred to as a "rolling average," "running average," and the like, and can further be modified by performing a cumulative or weighted moving average, as desired. For instance, in applying a weighted moving average, embodiments of the disclosure can be configured to weigh recent output values more heavily than older output values.

Also as used herein, the terms "exceeds" or "satisfies" regarding a threshold value is used to mean that the respective value or values satisfy the predetermined threshold, such as being equal to or less than the threshold value, or being within the threshold value range. For example, if a sensed value falls below a minimum threshold, the value can "exceed" the threshold. It will be understood that such a determination may easily be altered to be satisfied by a positive/negative comparison, exceeding comparison, or a true/false comparison.

The respective current or voltage characteristic threshold can be based on, for example, at least one of a maximum bus voltage input to the switching component 28, a maximum leakage current through the switching component 28, a maximum upstream or downstream wiring length, or a minimum possible load impedance connected to output of the switching component 28. Additional threshold considerations can be included. Additionally, embodiments of the disclosure can be included wherein the processor 36 is configured to monitor the current or voltage characteristics selectively when the switching component 28 is in the opened state or continuously.

In another example operation of the arc fault detector 30, at least one of the current sensor 32, voltage sensor 34, or processor 36 can be configured to provide a rate of change in the respective current or voltage characteristic while the switching component 28 is in the opened state. In this example operation, the respective current or voltage characteristic can be monitored by the processor 36, which can compare the rate of change with a threshold rate of change. If the respective current or voltage characteristic exceeds the threshold rate of change, the processor 36 can perform some further operation or function indicative of an arc fault. In the aforementioned example, the rate of change in the respective current or voltage characteristic can include an instantaneous rate of change, or a moving average rate of change. The moving period or window for this alternative example can be different from the moving period or window of the previous example embodiment.

While only a single generator 18, solid state switch 26, set of transmission wires 22, electrical load 20, and arc fault detector 30 are illustrated for ease of understanding, alternate power distribution systems 24 are envisioned having one or more of the aforementioned components 18, 20, 22, 26, 30 configured to define a robust power distribution system 24, or network of systems 24. For example, alternative configurations are envisioned having more than one electrical load 20 coupled to each solid state switch 26, more than one set of transmission wires 22 configured in series or parallel, or more than one solid state switch 26 configured to selectively couple multiple sets of transmission wires 22 to additional portions of the power distribution system 24.

Figure 3:
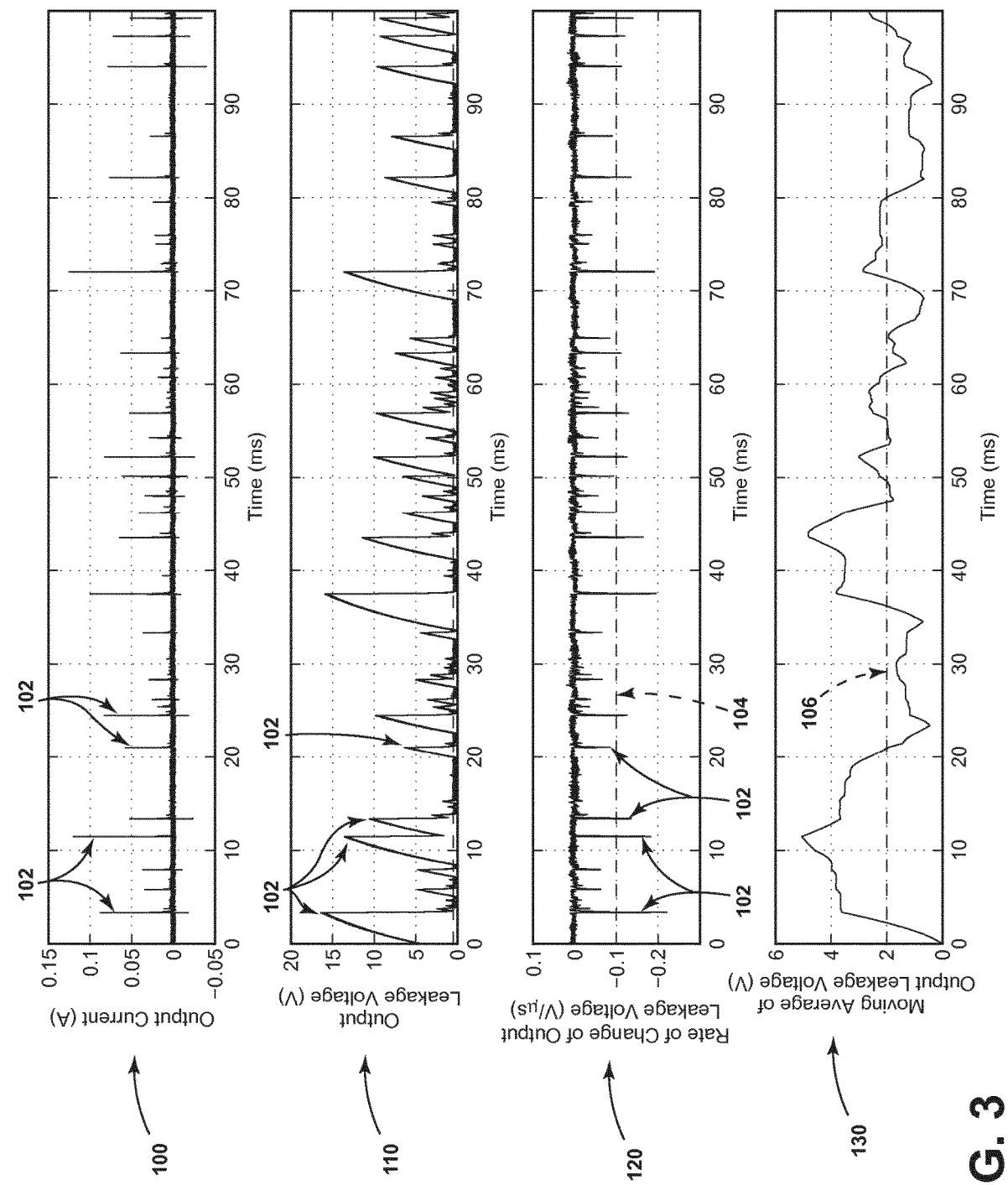
FIG. 3 is a series of plot graphs showing a fault detection response of the power distribution system, in accordance with various aspects described herein.

One embodiment of the power distribution system 24 operation can be further understood with reference to the time-aligned plot graphs presented in FIG. 3. As illustrated, a first plot 100 showing the output current sensed while the switching component 28 is open, for example, as measured by the current sensor 32. The plots also illustrate a second plot 110 showing the output leakage voltage sensed while the switching component 28 is open, for example, as measured by the voltage sensor 34. The plots additionally illustrate a third plot 120 showing a rate of change of the leakage voltage sensed while the switching component 28 is open, for example, as measured by the voltage sensor 34. A fourth plot 130 shows the moving average of the output leakage voltage sensed while the switching component 28 is open, for example, as measured by the voltage sensor 34. While the aforementioned plots 100-130 are described as measured by the respective current or voltage sensors 32, 34, embodiments of the disclosure are envisioned wherein at least one of the aforementioned plots 100-130 represent a sensed, measured, estimated, or determined set of respective plot 100-130 values, for example by way of determination, computation, or estimation of the processor 36.

The plots 100-120 illustrate a set of arc fault events 102 corresponding to a sharp or sudden change in the respective current or voltage signals. This change in, for example, the current signal of the first plot 100 can exemplify a sudden jump or rise in current due to a shorting arc fault while the switching component 28 is in the open state. Similarly, the arc fault event 102 change in the voltage signal of the second and third plots 110, 120 can exemplify a sudden drop or negative change in voltage due to the shorting arc fault while the switching component 28 is in the open state.

As illustrated in the third plot 120, the rate of change of the output leakage voltage can be compared with a rate of change threshold value (illustrated as dotted line 104). When the rate of change signal drops below or "exceeds" the threshold value 104, the arc fault detector 30 or processor 36 can determine that an arc fault has occurred, and can respond by providing an arc fault indication, as previously described. Embodiments of the disclosure can include logging a number of arc fault events 102, and only determine that an arc fault has occurred, or only respond by providing the arc fault indication after a predetermined number of arc fault events 102, for example, after five arc fault events 102, or after five arc fault events 102 within a predetermined or moving period of time. In this sense, the arc fault detector 30 or processor 36 can prevent nuisance or "false" arc fault tripping. In another sense, the repeatedly determining of the arc fault events 102 can be utilized to build confidence that an actual fault exists, prior to taking any actions to mitigate the fault.

As illustrated in the fourth plot 130, another example embodiment of the disclosure can include comparing a moving average of the output leakage voltage signal with another moving average threshold value (illustrated as dotted line 106). When the moving average of the output voltage falls below, exceeds, or satisfies the threshold value 106, the arc fault detector 30 or processor 36 can determine that an arc fault has occurred, and can respond by providing an arc fault indication, as previously described. By utilizing a moving average of the output leakage voltage, the arc fault detector 30 or processor 36 can prevent nuisance or "false" arc fault tripping, since it is less likely "false" arc tripping events will occur with such regularity to cause the moving average to fall below the threshold 106.

While only a rate of change of the output leakage voltage (i.e. the third plot 120) and a moving average of the output leakage voltage (i.e. the fourth plot 130) are illustrated, embodiments of the disclosure can be applied to signals indicative of the rate of change of the output leakage current, or to signals indicative of the moving average of the output leakage current, as previously described. These alternative embodiments can include respective rate of change or moving average threshold values. Additionally, while threshold values are described, embodiments of the disclosure can include threshold range values, wherein exceeding or falling below the threshold range can indicate an arc fault event.

Figure 4:
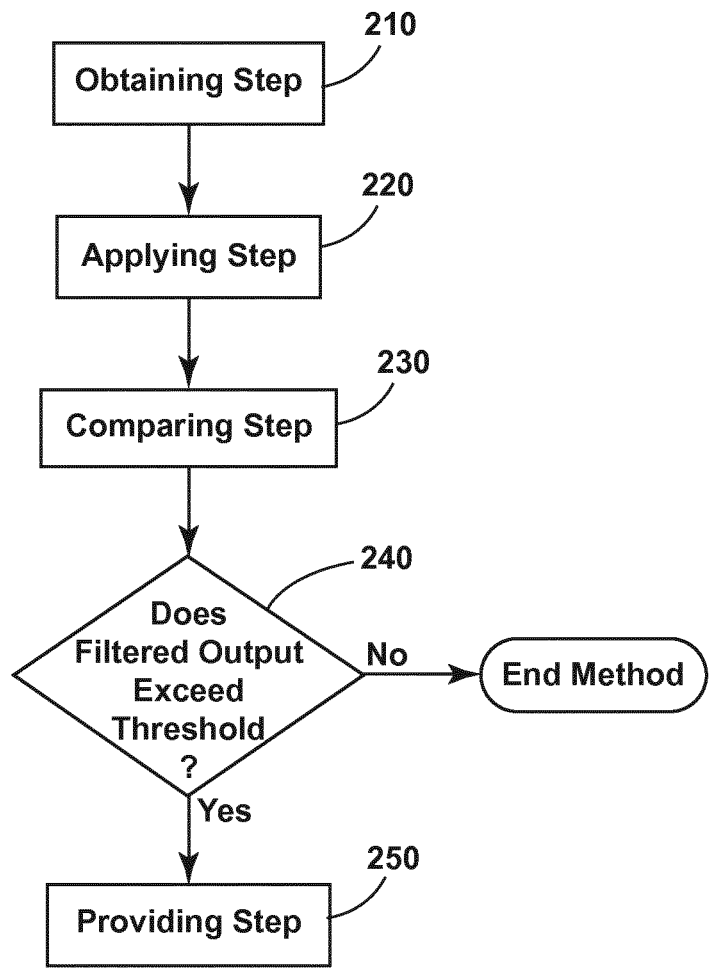
FIG. 4 is an example a flow chart diagram of a method of detecting arc faults in a circuit, in accordance with various aspects described herein.

FIG. 4 illustrates a flow chart demonstrating a method 200 of detecting arc faults in a circuit having a switch. The method 200 begins with an obtaining step 210, wherein at least one of the current sensor 32, the voltage sensor 34, the arc fault detector 30, or the processor 36 obtains respective output current or voltage values from the switching component 28 while the switching component 28 is open, or in the open state. The method 200 then moves to an applying step 220, wherein at least one of the arc fault detector 30 or processor 36 applies a moving average filter to the respective output current or voltage values to obtain a filtered output. The applying step 220 is followed by a comparing step 230, wherein the filtered output is compared to an arc fault threshold value or range. In a decision step 240, the method 200 determines whether the filtered output exceeds or satisfies the threshold value or range. If the filtered output does not exceed or satisfy the threshold value or range, the method 200 ends. If the filtered output exceeds or satisfies the threshold value or range, the method 200 continues to a providing step 250, wherein the arc fault detector 30 or processor 36 provides the arc fault indication, as explained herein.

Figure 5:
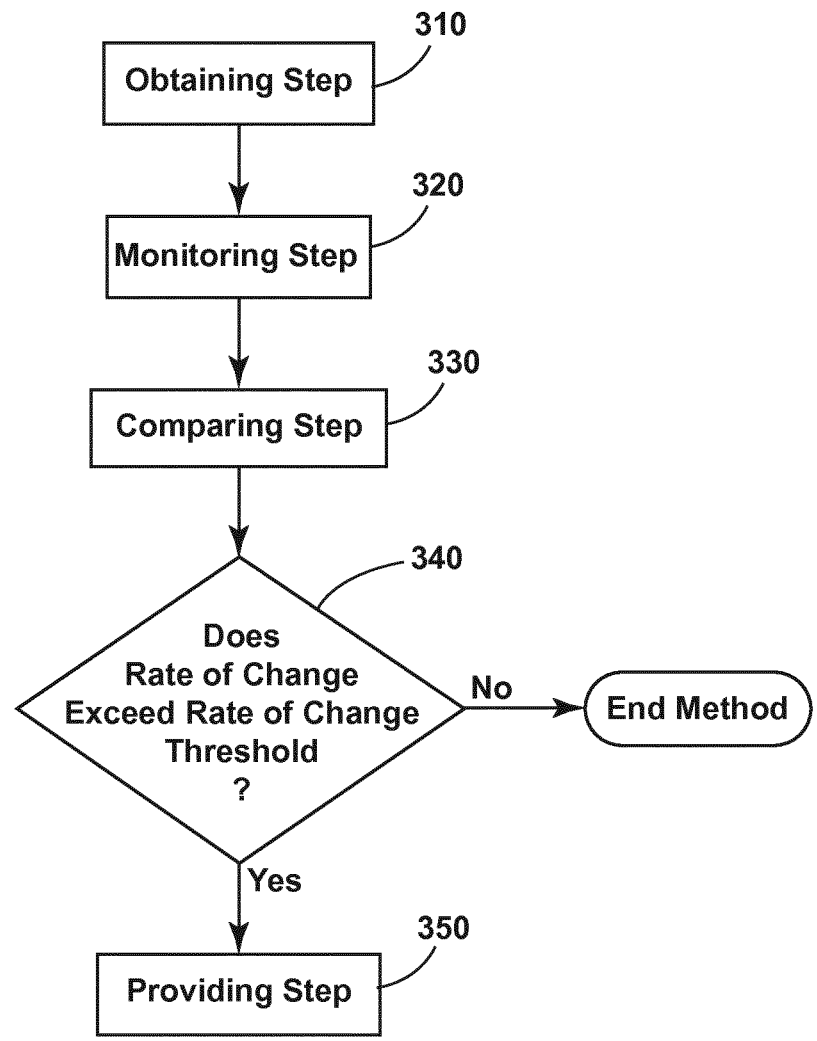
FIG. 5 is an alternative example a flow chart diagram of a method of detecting arc faults in a circuit, in accordance with various aspects described herein.

FIG. 5 illustrates another flow chart demonstrating an alternative method 300 of detecting arc faults in a circuit having a switch. The method 300 begins with an obtaining step 310, wherein at least one of the current sensor 32, the voltage sensor 34, the arc fault detector 30, or the processor 36 obtains respective output current or voltage values from the switching component 28 while the switching component 28 is open, or in the open state. The method 300 then moves to an monitoring step 320, wherein at least one of the arc fault detector 30 or processor 36 monitors a rate of change in the respective output current or voltage values to obtain a rate of change. The monitoring step 320 is followed by a comparing step 330, wherein the rate of change is compared to rate of change threshold value or range. In a decision step 340, the method 300 determines whether the rate of change exceeds or satisfies the rate of change threshold value or range. If the rate of change does not exceed or satisfy the rate of change threshold value or range, the method 300 ends. If the rate of change exceeds or satisfies the rate of change threshold value or range, the method 300 continues to a providing step 350, wherein the arc fault detector 30 or processor 36 provides the arc fault indication, as explained herein.

The methods 200, 300 can allow for the above-described process to run multiple times in order to improve a 'confidence' of, to estimate the presence of, or to confirm the presence of, an electrical arcing event, prior to the respective providing steps 250, 350. For example, the methods 200, 300 or arc fault detector 30 can be operated to confirm the existence of a suspected fault. In this embodiment, the arc fault detector 30 can interrupt the normal operation of the solid state switch 26 or switching component 28, to open the switching component 28 and perform the methods 200, 300. This improving of confidence in the method can avoid power distribution quality issues, or nuisance circuit tripping in response to false arcing events.

Many other possible embodiments and configurations in addition to that shown in the above figures are contemplated by the present disclosure. For example, it is envisioned that embodiments of the invention can be included at multiple points of a power distribution network such that a particular point or segment comprising the electrical failure can be determined, and, for instance, a power supply can be rerouting through an alternative electrical path to reach the electrical loads 20. The thresholds described herein can be estimated, arbitrarily set, determined empirically, or be defined with reference to an existing value (e.g. 2 volts above or below the moving average of the output voltage). Additionally, the design and placement of the various components can be rearranged such that a number of different in-line configurations could be realized.

The embodiments disclosed herein provide an apparatus and method for detecting electrical faults in a circuit. A beneficial effect is that the above described embodiments enable the detecting or confirming of electrical faults in a circuit, and providing indication of the detection or confirmation of such faults. One advantage that can be realized in the above embodiments is that the above described embodiments provide for active detection of arcing electrical faults by confirming the fault, and thus reducing erroneous false-positive fault indications. Another advantage of the above described embodiments is that the method can be run multiple times in order to confirm the presence of an electrical fault before taking appropriate actions, and thus can improve power quality by reducing nuisance tripping events. The method can also employ filtering techniques to further reduce erroneous false-positive fault indications. Additionally, the method allows for uninterrupted electrical load operation in the event that a false-positive fault is indicated, but not confirmed.

Another advantage of the above described embodiments is that an arc fault detector in an electrical system or network of arc even detectors in one or more electrical systems can be able to precisely define where an electrical fault is taking place. This can allow for a very robust system wherein arcing events can be quickly located (and safely interrupted) due to the proximity of one or more arc fault detectors to any given failure point. Additionally, by locating the point of failure, the system can allow for rerouting of power around the fault (if available), providing redundancy in the electrical network. The above described embodiments, thus, provide for increased safety for an aircraft electrical power distribution system and hence improve the overall safety of the aircraft and air travel. Furthermore, precisely defining where an electrical fault is taking place reduces or eliminates any additional maintenance time or costs associated with having to manually test and locate the electrical failure.

Yet another advantage of the above described embodiments is that the arc fault detector can be configured to operate by monitoring or reviewing the leakage current or leakage voltage when the switch is in the opened state This written description uses examples to disclose the invention, including the best mode, and also to enable any person skilled in the art to practice the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An apparatus for detecting arc faults in a circuit having a switch, the apparatus comprising:
   a leakage current management device configured to dissipate at least a portion of power due to a leakage current or voltage experienced while the switch is open;
   an arc fault detector arranged to monitor output voltage across the leakage current management device while the switch is open, and to send a signal representative of the output voltage; and
   a controller coupled to the arc fault detector;
   wherein the controller is configured to monitor the output voltage signal, apply a moving average filter to the output voltage signal to obtain a filtered output, compare the filtered output to a threshold, and if the filtered output exceeds the threshold, provide an arc fault indication.

2. The apparatus of claim 1 wherein the controller is further configured to monitor a rate of change in the output voltage signal.

3. The apparatus of claim 2 wherein the controller is further configured to monitor a rate of change in the output voltage signal after the switch is opened.

4. The apparatus of claim 3 wherein the controller is further configured to apply a moving average filter to the rate of change in the output voltage signal to obtain the filtered output, compare the filtered output to a threshold rate of change, and if the filtered output exceeds the threshold rate of change, provide an arc fault indication.

5. The apparatus of claim 1 wherein the threshold is based on at least one of a maximum bus voltage input to the switch, a maximum leakage current through the switch, a maximum upstream or downstream wiring length, or a minimum possible load impedance connected to output of the switch.

6. The apparatus of claim 1 wherein the controller is further configured to monitor the output voltage signal continuously.

7. The apparatus of claim 1 wherein the controller is further configured to operate the switch to open to confirm a suspected arc fault.

8. The apparatus of claim 1 wherein the arc fault detector is further arranged to monitor output current through the leakage current management device while the switch is open, and to send a signal representative of the output current, and wherein the controller is configured to monitor the output current signal, apply a moving average filter to the output current signal to obtain a filtered current output, compare the filtered current output to a current threshold, and if the filtered current output exceeds the current threshold, provide an arc fault indication.

9. The apparatus of claim 8 wherein the controller is further configured to monitor a rate of change in the output current signal.

10. The apparatus of claim 9 wherein the controller is further configured to apply a moving average filter to the rate of change in the output current signal to obtain the filtered current output, compare the filtered current output to a threshold rate of change, and if the filtered current output exceeds the threshold rate of change, provide an arc fault indication.

11. A method of detecting arc faults in a circuit having a switch, the method comprising:
    dissipating, by a leakage current management device, at least a portion of power due to a leakage current or voltage experienced while the switch is open;
    obtaining, by an arc fault detector, output voltage values from a switch while the switch is open;
    applying, by a controller coupled to the arc fault detector, a moving average filter to the output voltage values to obtain a filtered output;
    comparing, by the controller, the filtered output to a threshold; and
    in response to the filtered output exceeding the threshold, providing an arc fault indication.

12. The method of claim 11 wherein the obtaining output voltage values includes obtaining output voltage rate of change values.

13. The method of claim 12 wherein the applying includes applying a moving average filter to the output voltage rate of change values, and wherein the comparing includes comparing the filtered output to a rate of change threshold.

14. The method of claim 11 further includes identifying a suspected arc fault event and operating the switch to open, prior to the obtaining, and wherein the comparing the filtered output to a threshold confirms the arc fault event.

15. The method of claim 11 wherein the providing an arc fault indication includes providing an alarm, providing an audio indicator, providing a visual indicator, recording the arc fault indication, altering the operation of the switch, temporarily disabling the circuit, or permanently disabling the circuit.

16. The method of claim 11 wherein the applying a moving average filter includes applying at least one of a cumulative moving average filter or a weighted moving average filter to the output voltage values.

17. The method of claim 11 further comprising, prior to the obtaining, determining the presence of a suspected fault in a primary arc fault detections system configured to detect suspected faults while the switch is closed.

18. A method of detecting arc faults in a circuit having a switch, the method comprising:
   dissipating, by a leakage current management device, at least a portion of power due to a leakage current or voltage experienced while the switch is open;
   obtaining, by an arc fault detector, output voltage values from a switch after the switch is open;
   monitoring, by a controller coupled to the arc fault detector, a rate of change in the output voltage values;
   comparing, by the controller, the rate of change to a threshold; and
   in response to the rate of change satisfying the threshold, providing an arc fault indication.

19. The method of claim 18 wherein the arc fault indication relates to one of a loose terminal (Original) or a drawn series fault.

20. The method of claim 18 wherein the threshold is determined empirically, angle is equal to the second side angle.

21. The apparatus of claim 1 wherein the leakage current management device comprises a resistor.

22. The apparatus of claim 1 wherein the leakage current management device is configured to be disabled.

23. The apparatus of claim 1 wherein the leakage current management device is configured to dissipate a different portion of power while the switch is closed.

24. The apparatus of claim 1, wherein the threshold comprises a moving average threshold value.

* * * * *